(12) United States Patent
Ohtsuki et al.

(10) Patent No.: US 7,847,848 B2
(45) Date of Patent: Dec. 7, 2010

(54) SOLID-STATE IMAGING DEVICE HAVING A PLURALITY OF LINES FORMED IN AT LEAST TWO LAYERS ON SEMICONDUCTOR SUBSTRATE

(75) Inventors: Hirohisa Ohtsuki, Hyogo (JP); Ryohei Miyagawa, Kyoto (JP); Motonari Katsuno, Kyoto (JP); Mikiya Uchida, Kyoto (JP)

(73) Assignee: Panasonic Corporation, Osaka (JP)

( * ) Notice: Subject to any disclaimer, the term of this patent is extended or adjusted under 35 U.S.C. 154(b) by 393 days.

(21) Appl. No.: 11/969,527

(22) Filed: Jan. 4, 2008

(65) Prior Publication Data

US 2008/0278614 A1 Nov. 13, 2008

(30) Foreign Application Priority Data

May 10, 2007 (JP) ............................. 2007-125482

(51) Int. Cl.
*H04N 9/64* (2006.01)
*H04N 3/14* (2006.01)
*H04N 5/335* (2006.01)
*H01L 31/062* (2006.01)

(52) U.S. Cl. ...................... 348/308; 348/251; 348/302; 257/291

(58) Field of Classification Search ................ 348/302, 348/308, 251; 257/291, 258, 290
See application file for complete search history.

(56) References Cited

U.S. PATENT DOCUMENTS

| | | | |
|---|---|---|---|
| 6,008,511 A * | 12/1999 | Tokumitsu et al. ......... 257/232 |
| 6,518,640 B2 * | 2/2003 | Suzuki et al. ............... 257/432 |
| 6,838,715 B1 | 1/2005 | Bencuya et al. |
| 6,995,800 B2 * | 2/2006 | Takahashi et al. ........... 348/340 |
| 7,016,089 B2 * | 3/2006 | Yoneda et al. .............. 358/482 |
| 7,180,544 B2 | 2/2007 | Yamaguchi et al. |
| 7,214,920 B2 * | 5/2007 | Gazeley ................... 250/208.1 |
| 7,297,919 B2 * | 11/2007 | Mishina et al. .......... 250/208.1 |
| 7,408,140 B2 * | 8/2008 | Gazeley ................... 250/208.1 |
| 7,432,491 B2 * | 10/2008 | Silsby et al. ............. 250/208.1 |
| 7,557,847 B2 * | 7/2009 | Okita et al. ................. 348/308 |
| 7,667,174 B2 * | 2/2010 | Takayama et al. ........ 250/208.1 |
| 7,675,099 B2 * | 3/2010 | Hwang et al. ............... 257/292 |

(Continued)

FOREIGN PATENT DOCUMENTS

JP 2002-335455 11/2002

(Continued)

*Primary Examiner*—John M Villecco
(74) *Attorney, Agent, or Firm*—McDermott Will & Emery LLP

(57) ABSTRACT

In a MOS-type solid-state imaging device 1, in pixels 101 to 104 in which lines in an upper layer (charge transfer lines 1018 to 1048) are formed in shifted positions located toward a center $L_1$ of an image area, each two oppositely disposed pixels with the center $L_1$ of the image area sandwiched therebetween, such as a pixel 101 and a pixel 104 have the following relation. In each of the pixels 101 and 104, power supply lines 1016 and 1046, vertical signal lines 1017 and 1047, and charge transfer lines 1018 and 1048 relating to each of the pixels 101 and 104 are arranged symmetrically with respect to an imaginary plane extending from the center $L_1$ of a sensor 10 in a direction orthogonal to the drawing page in an X-axis direction.

8 Claims, 11 Drawing Sheets

U.S. PATENT DOCUMENTS

2006/0113460 A1* 6/2006 Tay .................... 250/208.1
2007/0210398 A1* 9/2007 Ohtsuki et al. .......... 257/431
2007/0222885 A1* 9/2007 Katsuno et al. ......... 348/340
2009/0008687 A1* 1/2009 Katsuno et al. ......... 257/292
2009/0021626 A1* 1/2009 Mori et al. ............ 348/308

FOREIGN PATENT DOCUMENTS

JP      2004-186407           7/2004
WO   WO 2006040963 A1 *   4/2006

* cited by examiner

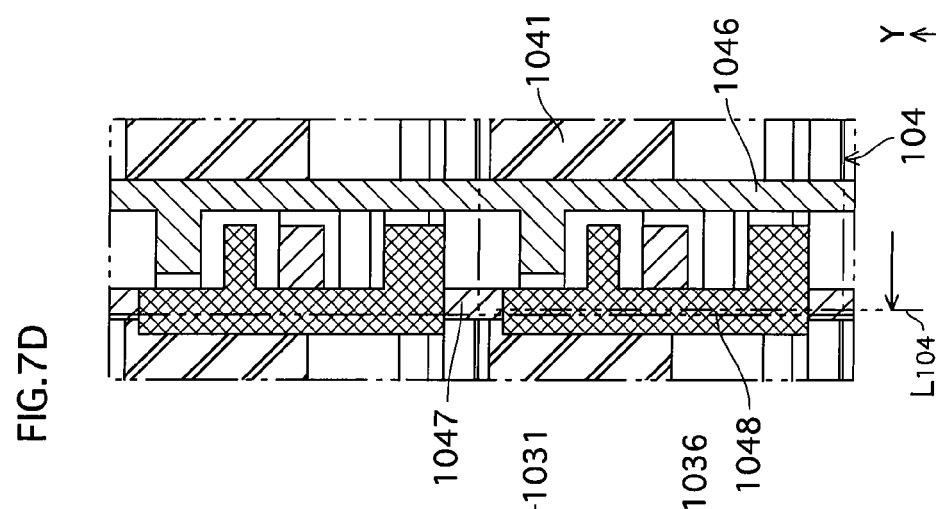
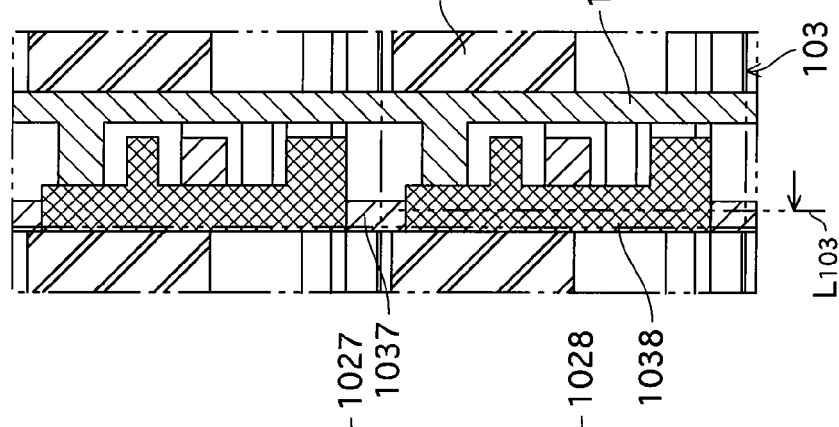
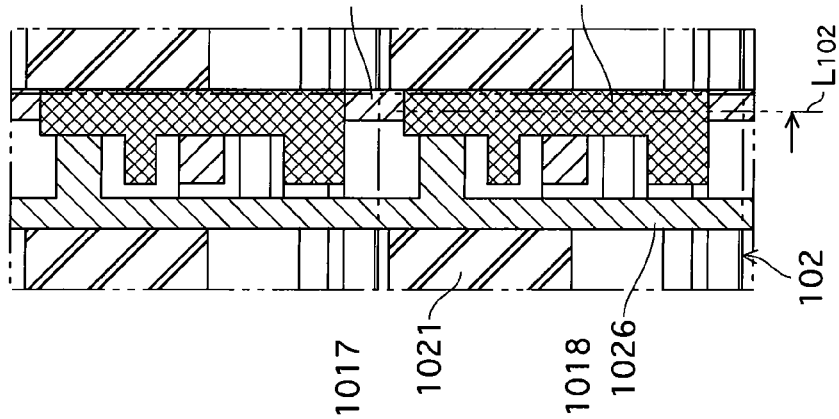
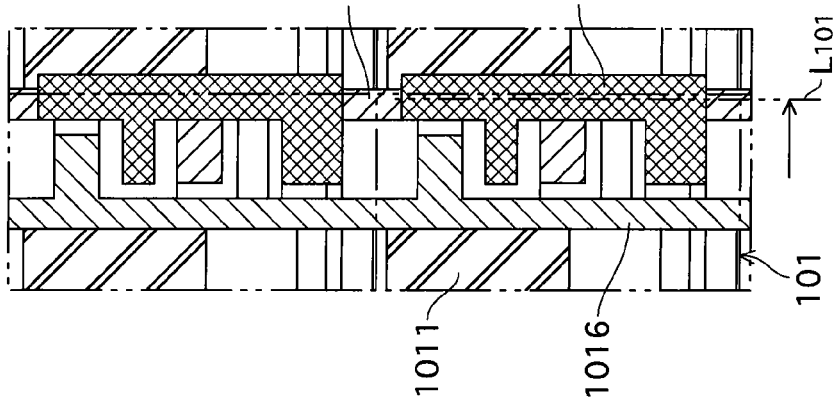

SOLID-STATE IMAGING DEVICE HAVING A PLURALITY OF LINES FORMED IN AT LEAST TWO LAYERS ON SEMICONDUCTOR SUBSTRATE

BACKGROUND OF THE INVENTION (1) Field of the Invention

The present invention relates to a solid-state imaging device, and especially to a structure of a sensor in a MOS-type solid-state imaging device.

(2) Related Art

A MOS-type solid-state imaging device which is used as an imaging device, such as a digital still camera, includes a sensor composed of a plurality of pixels arranged two-dimensionally (arranged in a matrix, for example) (Japanese Published Patent Application No. 2004-186407, Japanese Published Patent Application No. 2002-335455, and U.S. Pat. No. 6,838,715). The following describes a structure of a sensor in a conventional MOS-type solid-state imaging device, with reference to FIG. 1.

As shown in FIG. 1, a pixel 900 in the MOS-type solid-state imaging device includes a photodiode 9001 and three transistors (a transfer transistor 9002, an amplifying transistor 9004, and a reset transistor 9005). The photodiode 9001 is an element which converts received light into a charge corresponding to an intensity of the received light, and accumulates the converted charge. Also, one end of the photodiode 9001 is connected to a source of the transfer transistor 9002. On a drain side of the transfer transistor 9002, a floating diffusion (hereinafter, referred to as "FD") 9003 which receives a transferred charge is formed. The FD 9003 and the amplifying transistor 9004 are connected via a charge transfer line 9008.

Drains of the amplifying transistor 9004 and the reset transistor 9005 are connected to a power supply line 9006 that is extended in a Y-axis direction in FIG. 1, and a source of the amplifying transistor 9004 is connected to a vertical signal line 9007 that is extended in the Y-axis direction same as the power supply line 9006. After the transfer transistor 9002 is ON, the charge generated in the photoelectric conversion by the photodiode 9001 is transferred to the FD 9003. Also, after the signal charge is inputted to the gate of the amplifying transistor 9004, the amplified signal is outputted to the vertical signal line 9007.

The pixel 900 in the sensor has the above-mentioned structure. The following describes a layout of the charge transfer line 9008, the power supply line 9006, and the vertical signal line 9007 in the pixel 900, with reference to FIG. 2. Note that in FIG. 2, a plurality of pixels are expressed in pixels 901 to 904 by dividing them into forming areas of a sensor 90. However, each of the plurality of pixels 901 to 904 has a same structure as the pixel 900 with regard to a circuit.

As shown in FIG. 2, in the pixels 901 to 904, charge transfer lines 9018 to 9048 and vertical signal lines 9017 to 9047 are formed at the same height level in a thickness direction of the device. Also, power supply lines 9016 to 9046 are formed in an upper layer than the charge transfer lines 9018 to 9048 and the vertical signal lines 9017 to 9047. Moreover, in the pixels 901 to 904, each of centers $L_{901}$ to $L_{904}$ of the power supply lines 9016 to 9046 that are formed in the upper layer is in a shifted position located toward a center $L_9$ of the sensor 90, in accordance with each arrangement with respect to the center $L_9$ of the sensor 90 (which is referred to as so-called "shrink"). These shift arrangements of the power supply lines 9016 to 9046 are intended for an improvement in an oblique-incidence characteristic of incident light.

However, in the conventional MOS-type solid-state imaging device in which the power supply lines 9016 to 9046 are arranged in the shifted positions located toward the center $L_9$ of the sensor 90 as shown in FIG. 2, output signals in the pixels 901 to 904 vary, causing uneven brightness of an output image, i.e. so-called shading occurs. In detail, in the structure in which the power supply lines 9016 to 9046 are arranged in the shifted positions located toward the center $L_9$ of the sensor 90 by shrink as shown in FIG. 2, the pixels 901 and 902 that are located on a left side in a X-axis direction differ from the pixels 903 and 904 that are located on a right side in the X-axis direction in the following respect. That is, distances between the power supply lines 9016, 9026 and the charge transfer lines 9018, 9028 are different from distances between the power supply lines 9036, 9046 and the charge transfer lines 9038, 9048. This causes a difference between parasitic capacitances C9011 to C9041 in the pixels 901 to 904.

The parasitic capacitances C9011 to C9041 in the pixels 901 to 904 are location elements which compose a capacitance of the FD 9003, and the variations between the parasitic capacitances C9011 to C9041 cause a difference of output signals when same number of electrons are generated in photodiodes 9011 to 9041.

SUMMARY OF THE INVENTION

In view of the above problem, an object of the present invention is to provide a solid-state imaging device that can suppress shading without decreasing an oblique-incidence characteristic of incident light.

To fulfill the above object, the solid-state imaging device of the present invention includes an image area which is composed of a plurality of pixels arranged two-dimensionally in a direction along one main surface of a semiconductor substrate (hereinafter, referred to as "substrate main surface"), and each of the plurality of pixels includes a photodiode, a FD (floating diffusion), an amplifying transistor, and a first line.

Here, the photodiode has a function of converting incident light into a charge corresponding to an intensity of the incident light. To the FD, the charge generated in the photoelectric conversion by the photodiode is transferred, and the amplifying transistor amplifies the charge from the FD and outputs the amplified charge. The first line connects the FD to the amplifying transistor. Also, in the solid-state imaging device of the present invention, a second line that supplies power is connected to one of a drain and a source of the amplifying transistor in each of the plurality of pixels, and a third line that outputs a signal amplified by the amplifying transistor is connected to another one of the drain and the source of the amplifying transistor.

In the solid-state imaging device of the present invention that has the above-mentioned structure, one of the first, second, and third lines is arranged in one of a plurality of layers in a thickness direction of the semiconductor substrate on the substrate main surface, and the other lines are arranged in another layer of the plurality of layers (i.e. the lines are arranged in at least two layers). One line (hereinafter, referred to as "upper layer line") is arranged in a layer farthest from the substrate main surface (hereinafter, referred to as "upper layer"), and other lines (hereinafter, referred to as "lower layer lines") are arranged in parallel to each other in a layer closer to the substrate main surface than the upper layer (hereinafter, referred to as "lower layer"). In the solid-state imaging device of the present invention, in each pixel surrounding a center of the image area in the direction along the substrate main surface (in a direction in which the plurality of pixels are arranged two-dimensionally), the upper layer line is in a shifted position located toward the center of the image area. Also, in each two oppositely disposed pixels with the center of the image area sandwiched therebetween, the first line and at least one of the second and third lines are disposed symmetrically with respect to an imaginary plane extending from the center of the image area in a direction orthogonal to both of the shift direction and the direction along the substrate main surface.

As mentioned above, in the solid-state imaging device of the present invention, the upper layer line is formed in the shifted position located toward the center of the image area. Therefore, oblique incident light is less likely to be shielded by the upper layer line formed in the shifted position. As a result, a high oblique-incidence characteristic of incident light can be obtained in the solid-state imaging device of the present invention.

Moreover, in the solid-state imaging device of the present invention, in the case of the pixel in which the upper layer line is formed in the shifted position, in each two oppositely disposed pixels with the center of the image area sandwiched therebetween, the first line and at least one of the second and third lines relating to each of the pixels are disposed symmetrically with respect to the imaginary plane in the direction along the substrate main surface. Therefore, in the solid-state imaging device of the present invention, between the pixels in which the upper layer line is formed in the shifted position in order to obtain a high oblique-incidence characteristic, and the lower layer line is formed symmetrically with respect to the imaginary plane, a distance between the first line and at least one of the second and third lines does not vary greatly. Thus, in the solid-state imaging device of the present invention, between the two oppositely disposed pixels with the center of the image area sandwiched therebetween, a difference of a parasitic capacitance in the FD is smaller than the conventional solid-state imaging device, and thus uneven brightness of an output image is less likely to be caused (shading is less likely to occur).

Therefore, in the solid-state imaging device of the present invention, shading can be suppressed without decreasing an oblique-incidence characteristic of incident light.

Note that the present invention can be applied to a so-called multi-pixel one-cell structure in which a plurality of photodiodes and transfer transistors are provided in one pixel, or a structure in which a selecting transistor is inserted between a source of the amplifying transistor and the third line.

Also, in the solid-state imaging device of the present invention, it is more desirable to adopt the following structure because a difference of a parasitic capacitance in the FD between the pixels can be smaller. The structure is that, in the case of the pixel in which the upper layer line is formed in the shifted position, in each two oppositely disposed pixels with the center of the image area sandwiched therebetween, all of the first, second, and third lines relating to each of the pixels are disposed symmetrically with respect to the imaginary plane.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 7A is a plan view showing a layout of the pixel 101 in the sensor 10;

FIG. 7B is a plan view showing a layout of a pixel 102 in the sensor 10;

FIG. 7C is a plan view showing a layout of a pixel 103 in the sensor 10;

FIG. 7D is a plan view showing a layout of the pixel 104 in the sensor 10;

DESCRIPTION OF THE PREFERRED EMBODIMENTS

The following describes preferred embodiments of the present invention, with reference to two concrete examples. Note that the following embodiments are examples of the present invention, and the present invention is not limited to the following embodiments other than the essential features thereof.

First Embodiment

1. Whole Structure of MOS-type Solid-state Imaging Device 1

Figure 3:
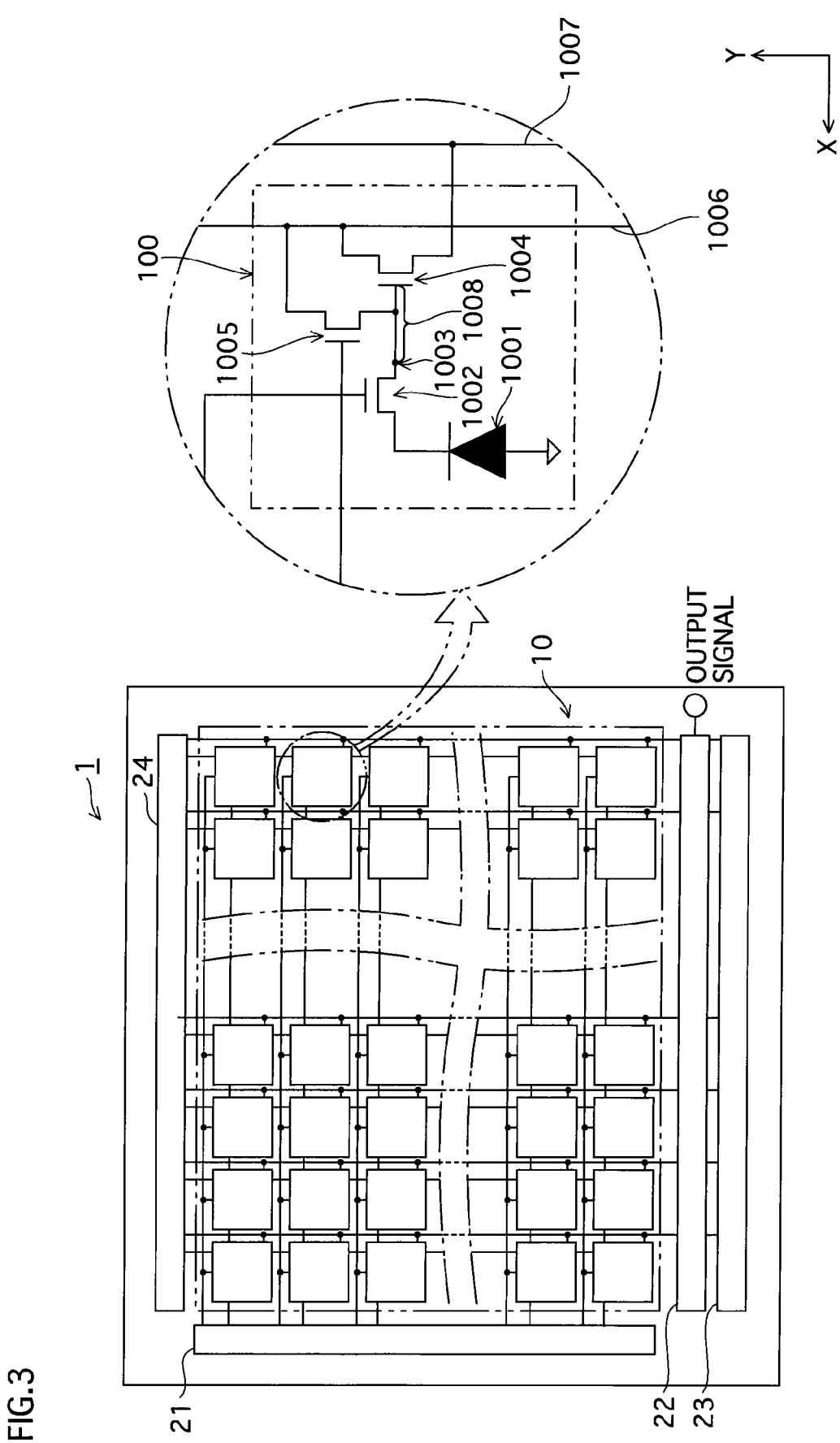
FIG. 3 is a block diagram showing a structure of a MOS-type solid-state imaging device 1 of a first embodiment.

The following describes a whole structure of a MOS-type solid-state imaging device 1 of a first embodiment, with reference to FIG. 3.

As shown in FIG. 3, the MOS-type solid-state imaging device 1 includes, on one semiconductor substrate, a sensor 10 and circuits 21 to 24 which are formed so as to surround the sensor 10. In the sensor 10, a plurality of pixels 100 are arranged in a matrix, and connected to the circuits 21 to 24 with lines. As shown in an enlarged part in FIG. 3, each of the plurality of pixels 100 includes a photodiode 1001, three transistors (a transfer transistor 1002, an amplifying transistor 1004, and a reset transistor 1005), and the like. On a drain side of the transfer transistor 1002, a floating diffusion (FD) 1003 is provided.

The photodiode 1001 is an element which generates a charge corresponding to an intensity of inputted light. Also, one end of the photodiode 1001 is connected to ground, and the other end thereof is connected to a source of the transfer transistor 1002. The transfer transistor 1002 is an element which transfers the charge generated by the photodiode 1001 to the FD 1003 as a detection part. Also, a drain of the transfer transistor 1002 is connected to a gate of the amplifying transistor 1004 and a source of the reset transistor 1005.

The reset transistor 1005 is an element which resets the charge accumulated in the FD 1003 at predetermined regular time intervals, and a drain of the reset transistor 1005 is connected to a power supply line 1006. The amplifying transistor 1004 is an element which amplifies the charge accumulated in the FD 1003. Also, a drain of the amplifying transistor 1004 is connected to the power supply line 1006, and a source of the amplifying transistor 1004 is connected to a vertical signal line 1007. The FD 1003 and the amplifying transistor 1004 are connected via a charge transfer line 1008.

In the MOS-type solid-state imaging device 1, the vertical shift register 21 and the horizontal shift register 23 are both dynamic circuits, and sequentially transmit a driving (switching) pulse to the plurality of pixels 100 or the pixel selection circuit 22, based on a timing signal from the timing generation circuit 24. Switching elements are built in the pixel selection circuit 22, each formed corresponding to pixels 100 in one row, and are sequentially ON when receiving a pulse from the horizontal shift register 23.

In each of the plurality of pixels 100 in the sensor 10, a charge generated in photoelectric conversion by the photodiode 1001 is read when the charge corresponds to a crossing part of a row selected by the vertical shift register 21 and a column in which the pixel selection circuit 22 is ON. The timing generation circuit 24 applies a power supply voltage, a timing pulse, and the like to the vertical shift register 21 and the horizontal shift register 23.

2. Connection in Sensor 10

Figure 4:
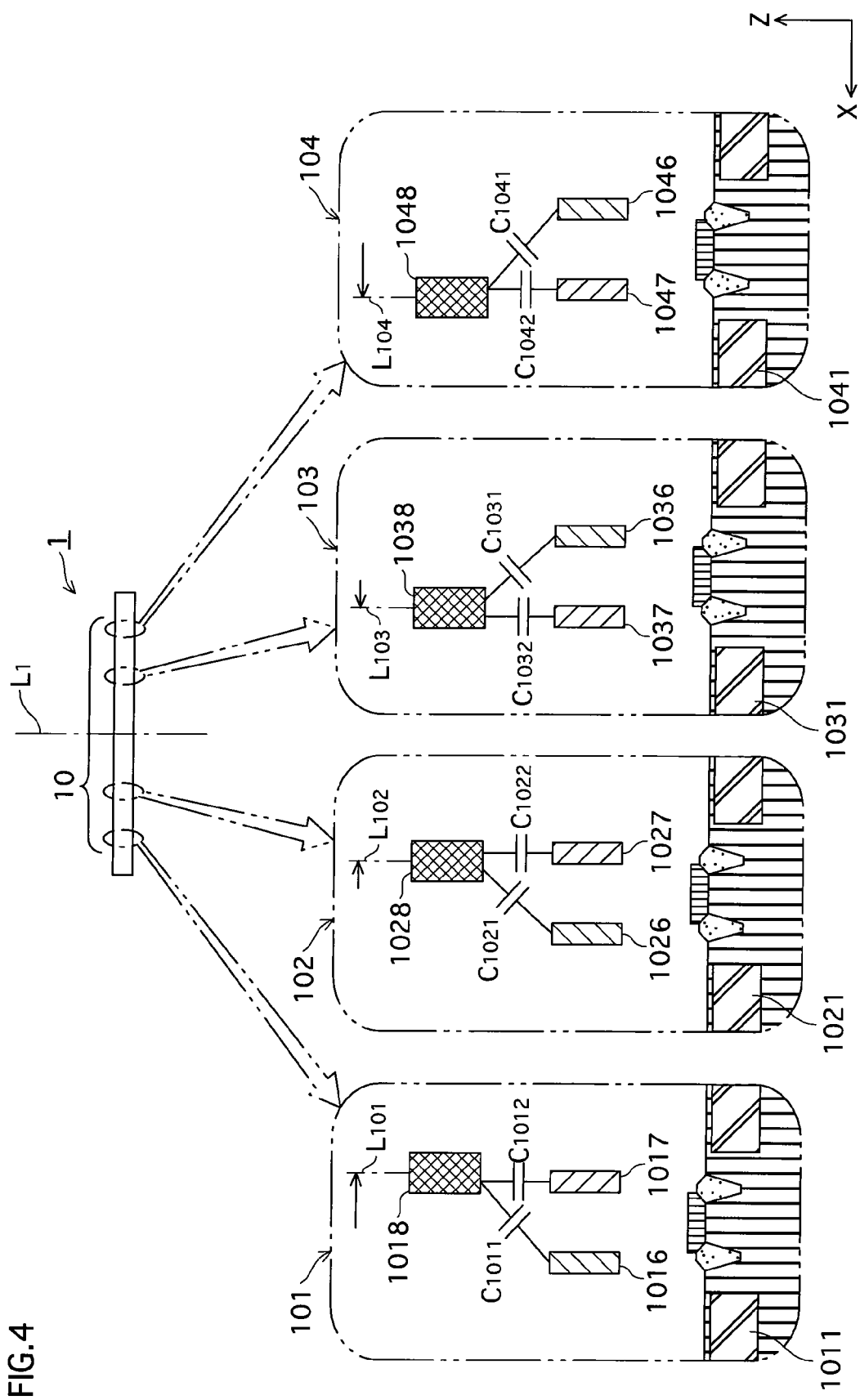
FIG. 4 is a connection diagram showing a connection layout for each area in a sensor 10 of the MOS-type solid-state imaging device 1.

The following describes a connection structure of the MOS-type solid-state imaging device 1 of the first embodiment, with reference to FIG. 4. In FIG. 4, four pixels 101 to 104 which are formed in an area that surrounds a center $L_1$ of the sensor 10 are used, and connection relations between lines 1016 to 1046, 1017 to 1047, and 1018 to 1048 in the pixels 101 to 104 are typically shown (an interlayer insulation film and the like are omitted). Note that the lines 1016 to 1046 in FIG. 4 correspond to the power supply line 1006 in FIG. 3. Similarly, the lines 1017 to 1047 in FIG. 4 correspond to the vertical signal line 1007 in FIG. 3, and the lines 1018 to 1048 in FIG. 4 correspond to the charge transfer line 1008 in FIG. 3.

As shown in FIG. 4, photodiodes 1011 to 1041 in the pixels 101 to 104 are formed inward in a thickness direction of the semiconductor substrate. In the pixels 101 to 104, the lines 1016 to 1046, 1017 to 1047, and 1018 to 1048 are formed in two layers upper than a main surface of the semiconductor substrate in the thickness direction thereof (Z-axis direction). In detail, in the first embodiment, the charge transfer lines 1018 to 1048 are arranged in one of the two layers, and the power supply lines 1016 to 1046 and the vertical signal lines 1017 to 1047 are arranged in the other layer of the two layers in the Z-axis direction. In the MOS-type solid-state imaging device 1 of the first embodiment, out of the two layers, on one layer closer to the main surface of the semiconductor substrate (hereinafter, referred to as "lower layer"), the power supply lines 1016 to 1046 and the vertical signal lines 1017 to 1047 are arranged in parallel to each other.

On the other layer farther from the main surface of the semiconductor substrate (hereinafter, referred to as "upper layer"), the charge transfer lines 1018 to 1048 are arranged in shifted positions located toward the center $L_1$ of the sensor 10 in the pixels 101 to 104. More specifically, in the pixel 101, a center line $L_{101}$ of the charge transfer line 1018 is shifted to a right side in an X-axis direction (the center $L_1$ side of the sensor 10), and in the pixel 102, a center line $L_{102}$ of the charge transfer line 1028 is shifted to the right side in the X-axis direction (the center $L_1$ side of the sensor 10). A shift amount of the charge transfer line 1018 in the pixel 101 which is farther from the center $L_1$ of the sensor 10 is larger than a shift amount of the charge transfer line 1028 in the pixel 102 which is closer to the center $L_1$ of the sensor 10.

In the same manner as this, in the pixels 103 and 104, the charge transfer lines 1038 and 1048 are arranged in the shifted positions located toward the center $L_1$ of the sensor 10. This arrangement of the lines 1018 to 1048 in the upper layer prevents oblique incident light from being shielded.

In the lower layer, the power supply lines 1016 to 1046 and the vertical signal lines 1017 to 1047 are formed.

In the MOS-type solid-state imaging device 1 of the first embodiment, the following applies to the arrangements of the pixels 101 and 102 that are arranged on the left side in the X-axis direction, and the arrangements of the pixels 103 and 104 that are arranged on the right side in the X-axis direction. All of the power supply lines 1016 to 1046, the vertical signal lines 1017 to 1047, and the charge transfer lines 1018 to 1048 are arranged symmetrically with respect to an imaginary plane extending from the center $L_1$ of the sensor 10 in a direction orthogonal to the drawing page. More specifically, in the pixel 101, the power supply line 1016 is arranged on a left side of the vertical signal line 1017, and the charge transfer line 1018 is arranged on an upper side of the vertical signal line 1017 in the Z-axis direction. On the other hand, in the pixel 104, the power supply line 1046 is arranged on a right side of the vertical signal line 1047, and the charge transfer line 1048 is arranged on an upper side of the vertical signal line 1047 in the Z-axis direction. As a result, all of the power supply lines 1016 and 1046, the vertical signal lines 1017 and 1047, and the charge transfer lines 1018 and 1048 are arranged symmetrically with respect to the imaginary plane extending from the center $L_1$ of the sensor 10 in the direction orthogonal to the drawing page in each of the pixels 101 and 104. In the same manner as this, all of the power supply lines 1026 and 1036, the vertical signal lines 1027 and 1037, and the charge transfer lines 1028 and 1038 are arranged symmetrically with respect to the imaginary plane in each of the pixels 102 and 103.

3. Drive of MOS-type Solid-state Imaging Device 1

The following describes a drive of the MOS-type solid-state imaging device 1, with reference to FIG. 3.

(1) The pixel 100 on which a reading operation has not been performed is in a non-selective state. More specifically, the transfer transistor 1002 and the reset transistor 1005 are both OFF, and an electric potential of the FD 1003 is maintained at a level at which the amplifying transistor 1004 does not drive.

(2) When one raw is selected, firstly, the reset transistor 1005 is ON, and the electric potential of the FD 1003 is reset at HIGH same as a power supply at this time.

Then, the reset transistor 1005 is OFF, but the electric potential of the FD 1003 is maintained at HIGH because of a parasitic capacitance C. As a result of this operation, the pixel 100 is selected.

(3) Next, when light enters the photodiode 1001 in the pixel 100, a charge is generated in photoelectric conversion, according to an amount of the incident light. Then, the generated charge is accumulated in the photodiode 1001.

(4) Next, when the transfer transistor 1002 is ON, the charge is transferred from the photodiode 1001 to the FD 1003. Note that the electric potential of the FD 1003 at this time is reduced by ΔV from HIGH.

$$\Delta V = n \times e / C \qquad \text{[Formula 1]}$$

Here, n indicates the number of electrons transferred to the FD 1003, and e is an elementary charge and $e = 1.6 \times 10^{-19}$ [C]. In the formula 1, C is a parasitic capacitance of the FD 1003.

The electric potential variation amount ΔV of the FD 1003 is transmitted to the gate of the amplifying transistor 1004, and a signal amplified by the amplifying transistor 1004 is outputted to the vertical signal line 1007.

(5) In the pixel 100 to which the signal is outputted, the transfer transistor 1002 is OFF, and the reset transistor 1005 is ON. Then, a voltage level of the power supply which is connected to the power supply line 1006 is reduced to a level at which the amplifying transistor 1004 does not drive, and the reset transistor 1005 is OFF. As a result of this operation, in the pixel 100, the electric potential of the FD 1003 is reset at a level at which the amplifying transistor 1004 does not drive (non-selective state).

4. Priority of MOS-type Solid-State Imaging Device 1

Figure 1:
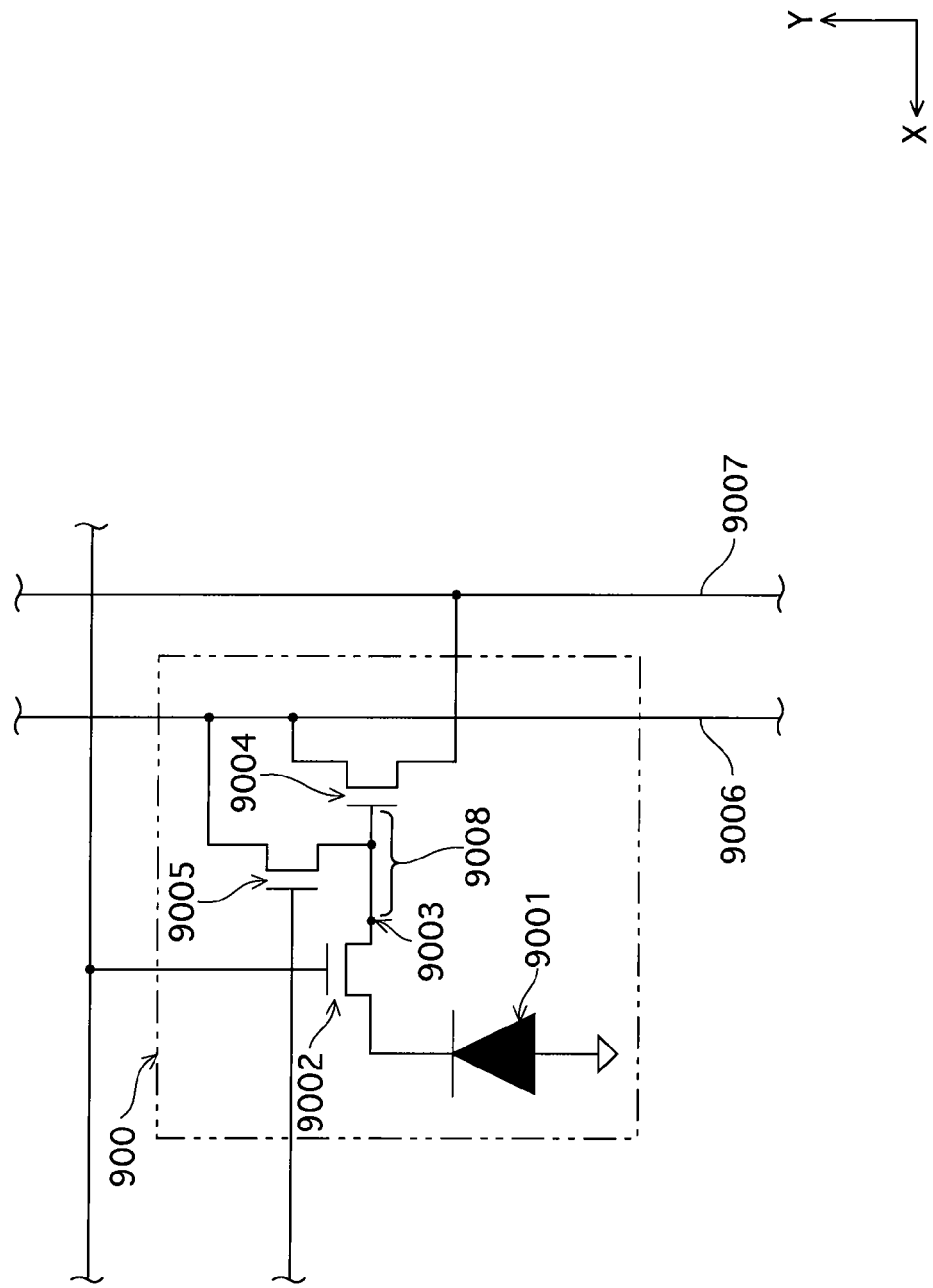
FIG. 1 is a circuit diagram showing a structure of a pixel 900 of a MOS-type solid-state imaging device of a conventional technique.
Figure 2:
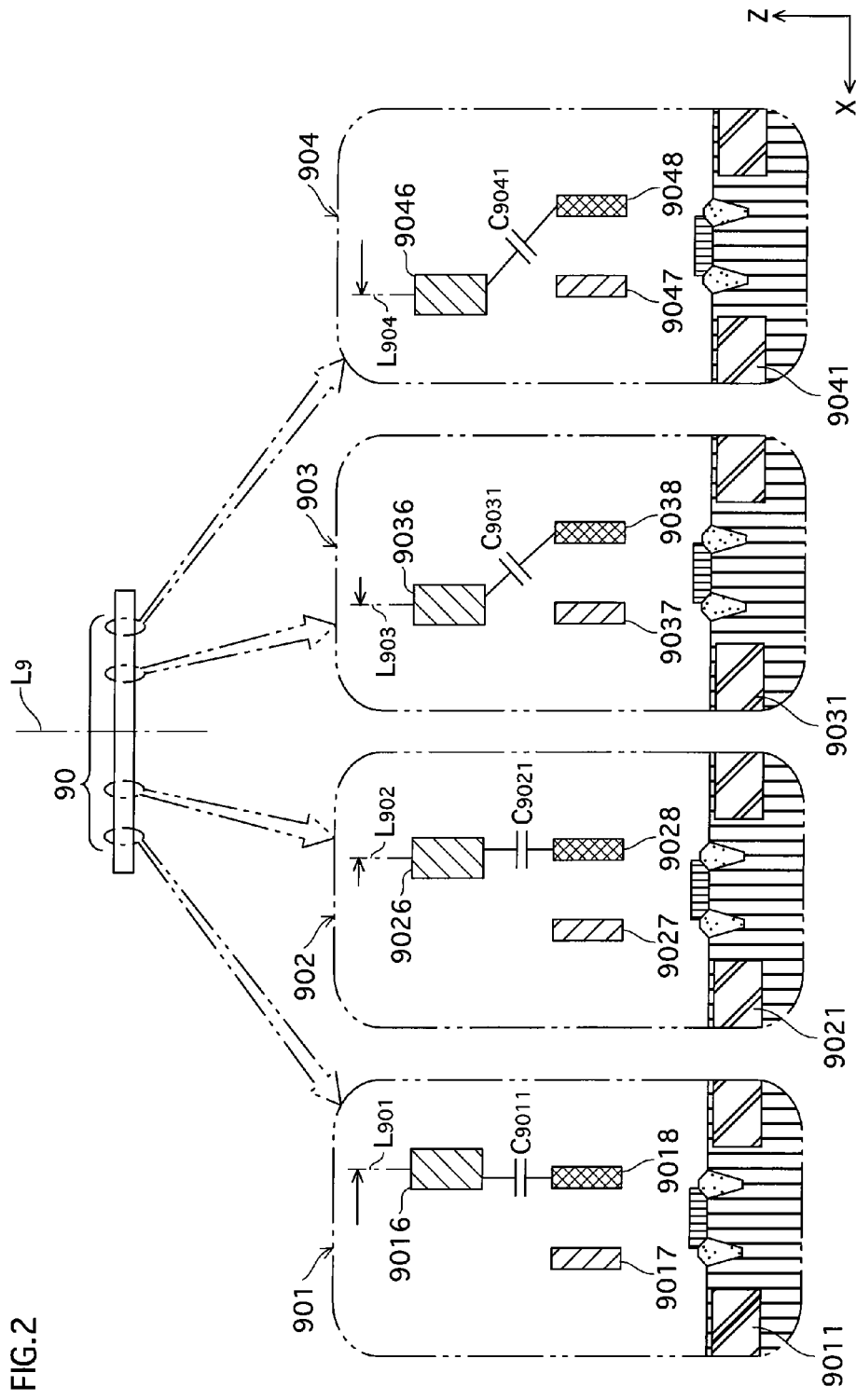
FIG. 2 is a connection diagram showing a connection layout for each area in a sensor 90 of the MOS-type solid-state imaging device of the conventional technique.

In the MOS-type solid-state imaging device 1 of the first embodiment, the arrangement of the lines 1016 to 1046, 1017 to 1047, and 1018 to 1048 shown in FIG. 4 is the largest characteristic. The following describes a priority of the MOS-type solid-state imaging device 1 of the first embodiment because of the above characteristic, by comparing with the conventional MOS-type solid-state imaging device shown in FIG. 2.

As shown in FIG. 4, in the MOS-type solid-state imaging device 1 of the first embodiment, all of the power supply lines 1016 to 1046, the vertical signal lines 1017 to 1047, and the charge transfer lines 1018 to 1048 are arranged symmetrically with respect to the imaginary plane extending from the center $L_1$ of the sensor 10 in the direction orthogonal to the drawing page in each of the pixels 101 to 104. Also, the lines 1018 to 1048 are arranged in the shifted positions located toward the center $L_1$ of the sensor 10. In this arrangement, between the charge transfer lines 1018 to 1048 and the power supply lines 1016 to 1046, parasitic capacitances C1011 to C1041 exist respectively, and between the charge transfer lines 1018 to 1048 and the vertical signal lines 1017 to 1047, parasitic capacitances C1012 to C1042 exist respectively.

In the MOS-type solid-state imaging device 1 of the first embodiment, in the pixels 101 and 102 on the left side in the X-axis direction and the pixels 103 and 104 on the right side in the X-axis direction, the charge transfer lines 1018 to 1048 in the upper layer and the power supply lines 1016 to 1046 and the vertical signal lines 1017 to 1047 in the lower layer are arranged symmetrically with respect to the imaginary plane. Therefore, in the pixels 101 to 104, the parasitic capacitances of the FD C1011 to C1041 indicate substantially same values.

Also, in the pixels 101 to 104, the parasitic capacitances of the FD C1012 to C1042 indicate substantially same values.

$$C1011 \approx C1021 \approx C1031 \approx C1041 \qquad \text{[Formula 2]}$$

$$C1012 \approx C1022 \approx C1032 \approx C1042 \qquad \text{[Formula 3]}$$

$$(C1011+C1012) \approx (C1021+C1022) \approx (C1031+C1032) \approx (C1041+C1042) \qquad \text{[Formula 4]}$$

As mentioned above, when the MOS-type solid-state imaging device 1 is driven, the electric potential variation amount ΔV of the FD 1003 is transmitted to the amplifying transistor 1004. However, as can be seen from the formula 1, the electric potential variation amount ΔV is greatly influenced by the parasitic capacitance C of the FD 1003. Also, in the MOS-type solid-state imaging device 1 of the first embodiment, as shown in FIG. 4, the parasitic capacitances C1011 to C1041, and C1012 to C1042 of the FD 1003 in a whole area of the sensor 10 are substantially same. Therefore, in the MOS-type solid-state imaging device 1 of the first embodiment, if charges generated by the photodiode 1001 are same in all of the pixels 100 in the sensor 10, signals outputted to the vertical signal line 1007 are substantially same, and thus an image can be outputted with less shading.

Note that in the MOS-type solid-state imaging device 1 of the first embodiment, the charge transfer lines 1018 to 1048 are formed in the upper layer, and arranged in the shifted positions located toward the center $L_1$ of the sensor 10. Therefore, even if the shift varies, the parasitic capacitances of the FD are substantially same in all of the pixels, as shown in the formula 4. Given that electric potentials of the vertical signal lines 1017 to 1047 vary according to an electric potential of the FD, the parasitic capacitances C1012 to C1042 between the charge transfer lines 1018 to 1048 and the vertical signal lines 1017 to 1047 are small in appearance. Thus, when the charge transfer lines 1018 to 1048 are arranged in the shifted positions on the upper side of the vertical signal lines 1017 to 1047, the variation of the parasitic capacitances C as the whole of the FD can be reduced to be smaller, compared with the case in which the charge transfer lines 1018 to 1048 are arranged in the shifted positions on the upper side of the power supply lines 1016 to 1046.

Also, in the MOS-type solid-state imaging device 1, the lines in the upper layer (the charge transfer lines 1018 to 1048) are formed in the shifted positions located toward the center $L_1$ of the sensor 10. Therefore, oblique incident light is less likely to be shielded, and thus a high oblique-incidence characteristic can be obtained.

Thus, in the MOS-type solid-state imaging device 1 of the first embodiment, shading can be suppressed while the high oblique-incidence characteristic is obtained. Therefore, high image quality performance can be realized.

5. Layout of Sensor 10

The following describes a specific layout for realizing the arrangement of the power supply lines 1016 to 1046, the vertical signal lines 1017 to 1047, and the charge transfer lines 1018 to 1048, with reference to FIGS. 5 to 7D. FIGS. 5 to 7D are plan views showing a layout for each layer in the thickness direction of the semiconductor substrate. According to a shift from FIG. 5 to FIG. 7D, a distance from the main surface of the semiconductor substrate becomes larger. Note that in the description with reference to FIG. 5, only the pixel 101 will be used for the description.

Figure 5:
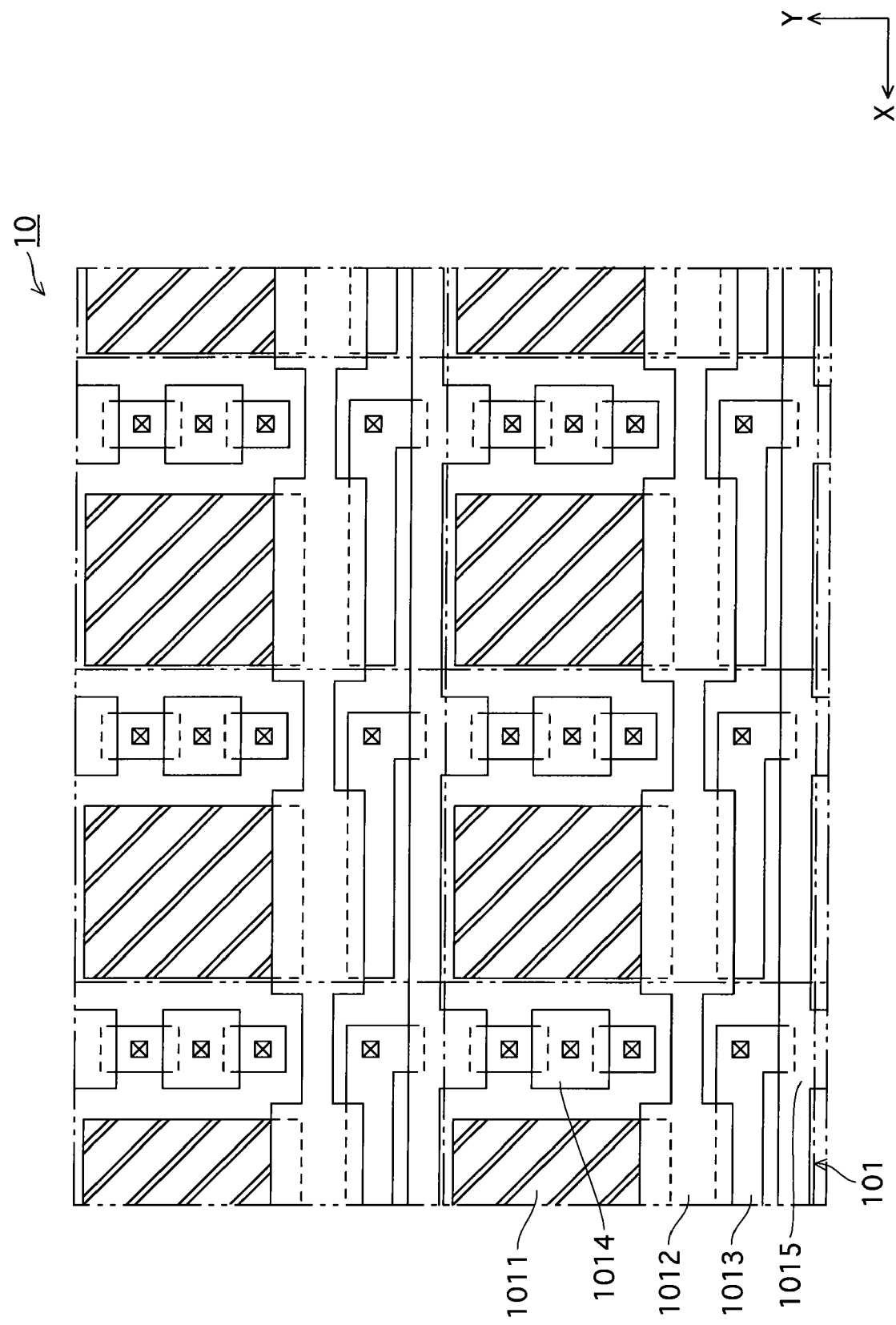
FIG. 5 is a plan view showing a layout of a pixel 101 in the sensor 10.

As shown in FIG. 5, in the MOS-type solid-state imaging device 1, photodiodes 1011 . . . each in a planar shape of a substantially rectangle are arranged in a X-Y plane in a matrix. A gate of a transfer transistor 1012 is provided so that an upper part thereof covers a lower periphery of the photodiode 1011 in a Y-axis direction. A lower part of the transfer transistor 1012 in the Y-axis direction covers an upper part of a FD 1013. The gate of the transfer transistor 1012 is continuously formed in an X-axis direction, and the FD 1013 is divided for each pixel 101 and formed in a shape of "L". In an upper part of a tip of the FD 1013 which is bent into the shape of "L", a gate of a reset transistor 1015 is arranged, which is formed so as to be extended in the X-axis direction.

On the other hand, between the photodiodes 1011 . . . in the X-axis direction, an amplifying transistor 1014 is formed.

Figure 6A:
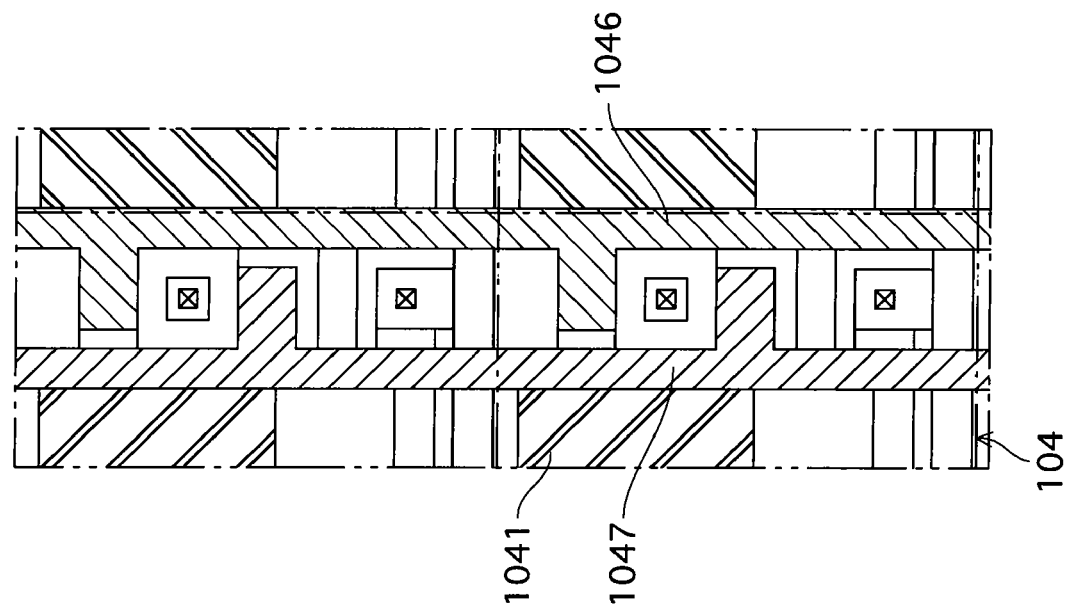
FIG. 6A is a plan view showing a layout of the pixel 101 in the sensor 10.
Figure 6B:
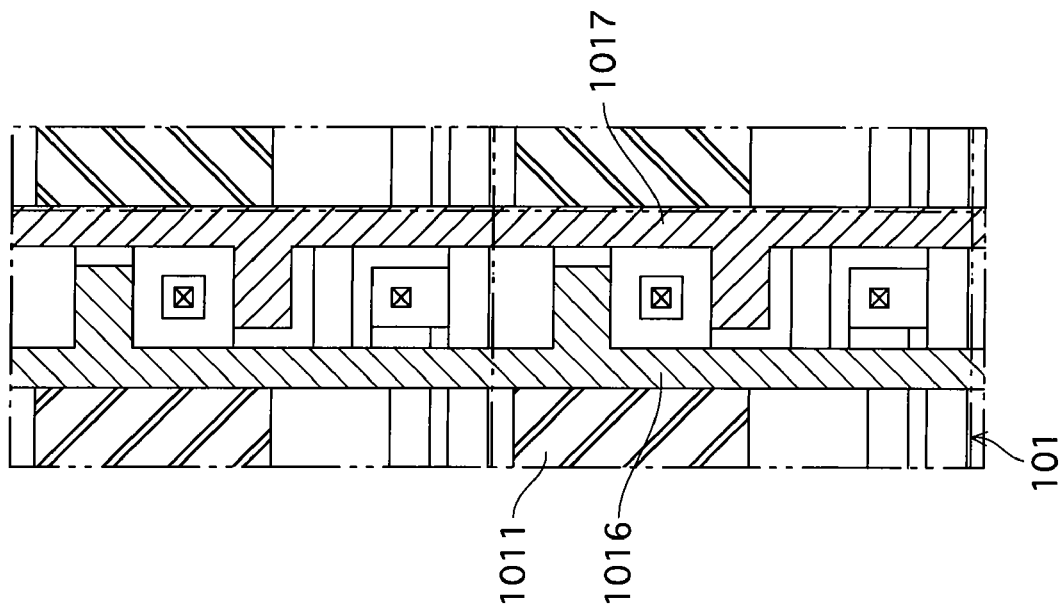
FIG. 6B is a plan view showing a layout of a pixel 104 in the sensor 10.

As shown in FIG. 6A, in the pixel 101, between the photodiodes 1011 . . . in the X-axis direction in a lower layer, the power supply line 1016 and the vertical signal line 1017 are arranged in parallel to each other so as to be extended in the Y-axis direction. In the same manner as this, as shown in FIG. 6B, the power supply line 1046 and the vertical signal line 1047 are formed in the pixel 104 so as to be extended in the Y-axis direction. As mentioned above, the power supply line 1016 and the vertical signal line 1017 corresponding to the pixel 101 shown in FIG. 6A and the power supply line 1046 and the vertical signal line 1047 corresponding to the pixel 104 shown in FIG. 6B are arranged symmetrically with respect to the imaginary plane.

As shown in FIGS. 7A and 7B, in the pixels 101 and 102, the charge transfer lines 1018 and 1028 are formed on upper sides of the vertical signal lines 1017 and 1027 which are arranged on right sides of the power supply lines 1016 and 1026 in the X-axis direction. The charge transfer lines 1018 and 1028 are formed so as to be extended in the Y-axis direction. On the other hand, as shown in FIGS. 7C and 7D, in the pixels 103 and 104, the charge transfer lines 1038 and 1048 are formed on upper sides of the vertical signal lines 1037 and 1047 which are arranged on left sides of the power supply lines 1036 and 1046 in the X-axis direction.

The charge transfer lines 1018 to 1048 are formed so that the center lines $L_{101}$ to $L_{104}$ thereof are in shifted positions located toward the center $L_1$ of the sensor 10. The charge transfer lines 1018 to 1048 and the lines arranged in the lower layer (the power supply lines 1016 to 1046, and the vertical signal lines 1017 to 1047) are arranged symmetrically with respect to the imaginary plane in each of the pixels 101 to 104.

6. Area Structure of Sensor 10

Figure 8:
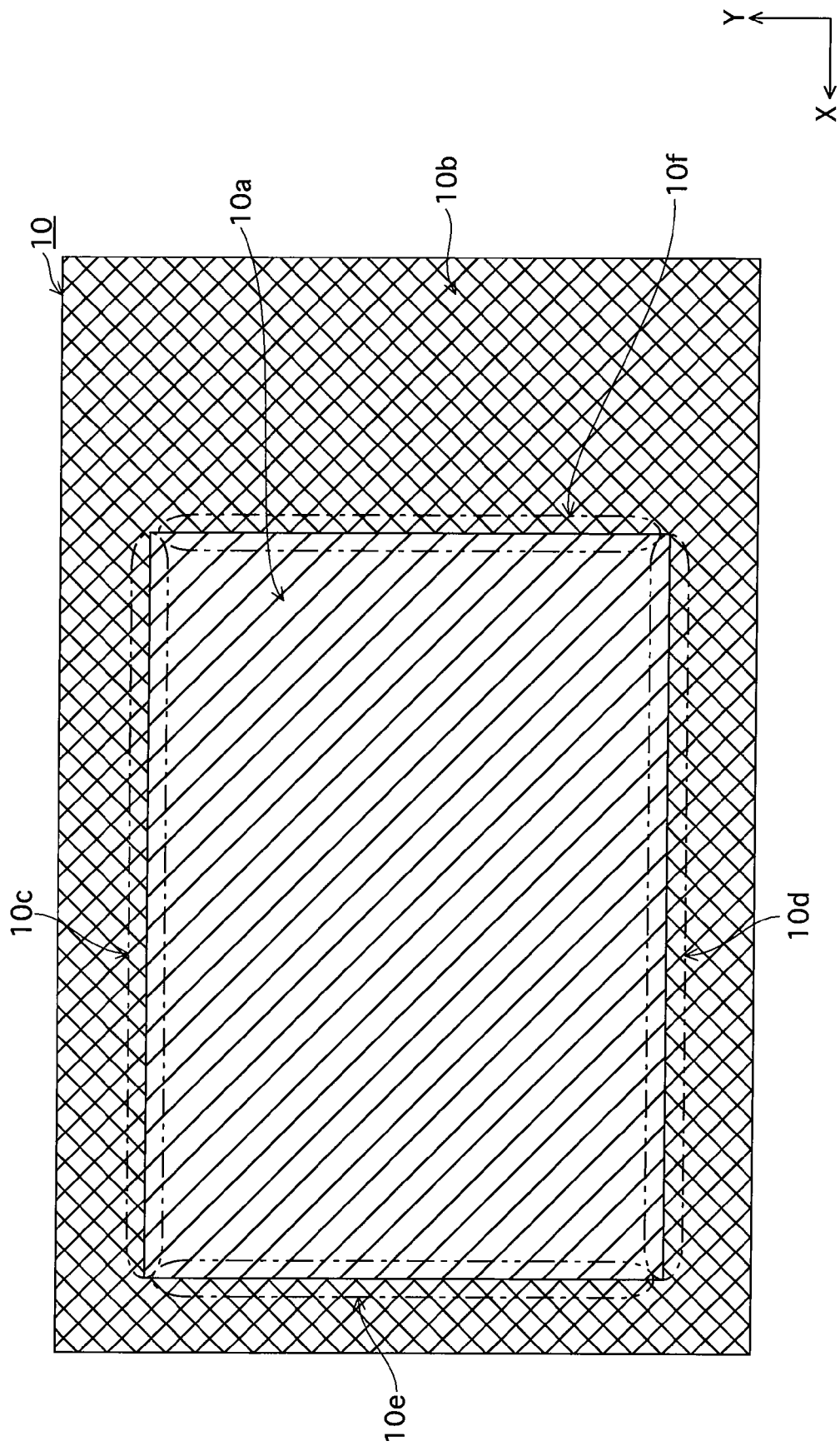
FIG. 8 is a plan view showing a layout of an effective pixel area 10a and a light shielding pixel area 10b in the sensor 10.

As shown in FIG. 8, in the sensor 10 of the MOS-type solid-state imaging device 1, a light shielding pixel area 10b is provided so as to surround a periphery of an effective pixel area 10a. The light shielding pixel area 10b is provided in order to detect a black level which is a reference in an imaged picture, and the whole of an upper area thereof such as the photodiode is covered with a metal wire. In the MOS-type solid-state imaging device 1 of the first embodiment, the power supply line 1006 is used as the metal wire for shielding light. Because the structure of the sensor 10 as shown in FIG. 8 is disclosed, for example, in Japanese Published Patent Application No. 2004-273566, a detailed explanation thereof will be omitted.

The following describes a connection layout in boundary areas 10c, 10d, 10e, and 10f between the effective pixel area 10a and the light shielding pixel area 10b.

7. Connection Layout in Boundary Area 10c

Figure 9A:
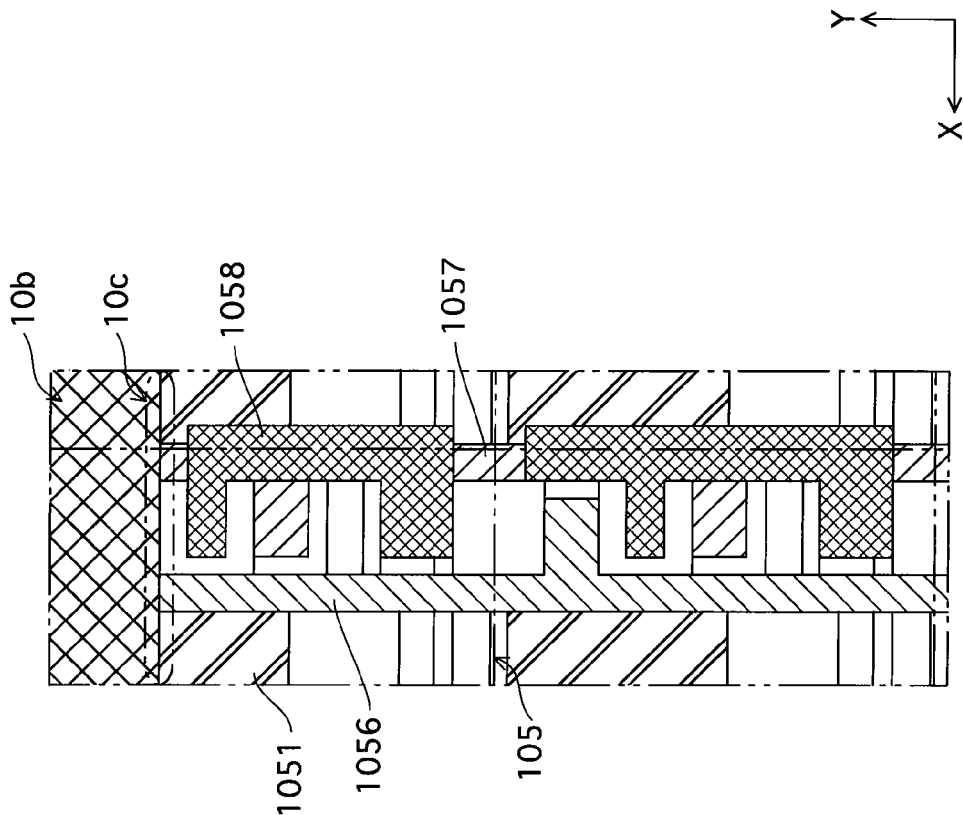
FIG. 9A is a connection diagram showing a connection layout of a lower layer in a boundary area 10c between the effective pixel area 10a and the light shielding pixel area 10b in the sensor 10.

As shown in FIG. 9A, in a pixel 105 including photodiode 1051 which is located at the boundary area 10c, a power supply line 1056 and a vertical signal line 1057 are arranged. One end of the power supply line 1056 in a Y-axis direction is formed in a shape of "T", and three contact plugs 1059 are provided in the T-shaped part. Note that the vertical signal line 1057 is formed so as to be extended in the Y-axis direction.

Figure 9B:
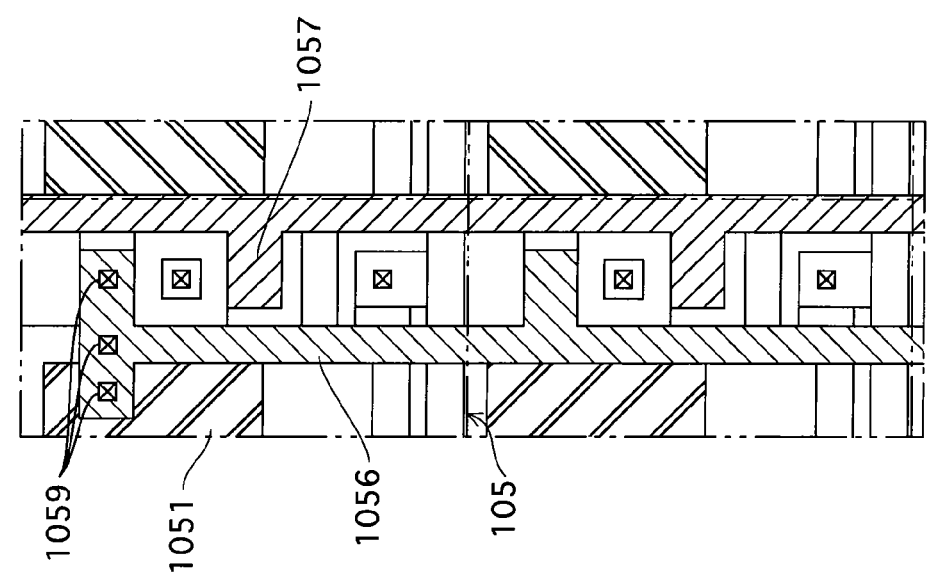
FIG. 9B is a connection diagram showing a connection layout of an upper layer in the boundary area 10c between the effective pixel area 10a and the light shielding pixel area 10b in the sensor 10.

As shown in FIG. 9B, a charge transfer line 1058 is formed on an upper side of the vertical signal line 1057, same as in the pixel 101 in FIG. 7A. The light shielding pixel area 10b is covered with the metal wire to shield light. In the first embodiment, a power supply is used as the metal wire as mentioned above. Therefore, in the boundary area 10c, the power supply line 1056 shown in FIG. 9A is connected to the metal wire using the three contact plugs 1059.

As mentioned above, the power supply line is used as the metal wire for shielding light in the light shielding pixel area 10b because of the following reason. Even if the power supply line is formed in adjacent columns in the X-axis direction so as to join the adjacent columns, the power supply line does not cause a problem.

In the MOS-type solid-state imaging device 1 of the first embodiment, the power supply line 1056 is connected to the metal wire in the boundary area 10c using the three contact plugs 1059. Therefore, a low resistance can be realized compared with a case in which the power supply line 1056 is connected to the metal wire in the boundary area 10c using only one contact plug.

As shown in FIG. 9B, in the MOS-type solid-state imaging device 1 of the first embodiment, the charge transfer line 1058 is formed in the upper layer. However, the charge transfer line 1058 is required to be electrically independent in each pixel. Thus, the charge transfer line 1058 has to avoid a connection with the metal wire in the light shielding pixel area 10b. Therefore, it is required that the charge transfer line 1058 is connected to a layer that is different from the layer (upper layer) in which the metal wire is formed, using the contact plugs so as to cross over (pass through) the metal wire in the light shielding pixel area 10b, though it is not shown in FIG. 9B. Here, it is preferable that a plurality of contact plugs for the connection are formed same as mentioned above.

Second Embodiment

1. Main Structure of MOS-type Solid-state Imaging Device 3

Figure 10:
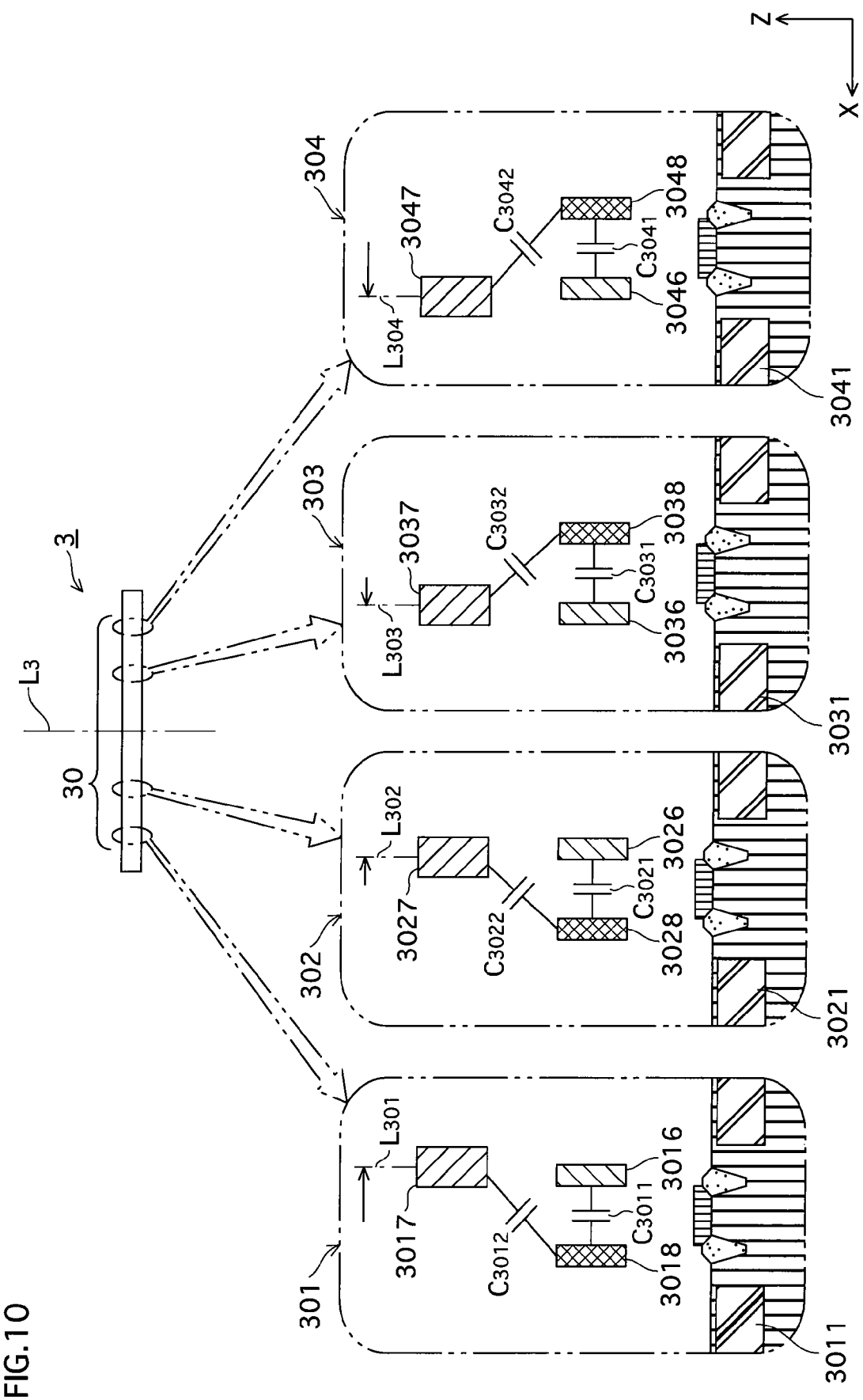
FIG. 10 is a connection diagram showing a connection layout for each area in a sensor 30 of a MOS-type solid-state imaging device 3 of a second embodiment.

The following describes a main structure of a MOS-type solid-state imaging device 3 of a second embodiment, with reference to FIG. 10. Since a circuit structure of the MOS-type solid-state imaging device 3 is same as the MOS-type solid-state imaging device 1 shown in FIG. 3, the circuit structure will not shown in a figure and an explanation thereof will be omitted.

As shown in FIG. 10, in the MOS-type solid-state imaging device 3 of the second embodiment, in all of pixels 301 to 304 including photodiodes 3011 to 3041, vertical signal lines 3017 to 3047 are formed in an upper layer, and power supply lines 3016 to 3046 and charge transfer lines 3018 to 3048 are formed in a lower layer. Also, in the second embodiment, the lines formed in the upper layer (the vertical signal lines 3017 to 3047) are arranged in shifted positions located toward a center $L_3$ of a sensor 30. More specifically, in the pixel 301, a center line $L_{301}$ of the vertical signal line 3017 is shifted to a right side in an X-axis direction (the center $L_3$ side of the sensor 30), and in the pixel 302, a center line $L_{302}$ of the vertical signal line 3027 is shifted to the right side in the X-axis direction (the center $L_3$ side of the sensor 30). A shift amount of the vertical signal line 3017 in the pixel 301 which is farther from the center $L_3$ of the sensor 30 is larger than a shift amount of the vertical signal line 3027 in the pixel 302 which is closer to the center $L_3$ of the sensor 30.

In the same manner as this, in the pixels 303 and 304, the vertical signal lines 3037 and 3047 are arranged in the shifted positions located toward the center $L_3$ of the sensor 30. Also, same as the arrangement relation between the power supply lines 1016 to 1046, the vertical signal lines 1017 to 1047, and the charge transfer lines 1018 to 1048 of the MOS-type solid-state imaging device 1 of the first embodiment (refer to FIG. 4), the vertical signal lines 3017 to 3047 formed in the upper layer, and the power supply lines 3016 to 3046 and the charge transfer lines 3018 to 3048 formed in the lower layer are arranged symmetrically with respect to an imaginary plane extending from the center $L_3$ of the sensor 30 in a direction orthogonal to the drawing page, in each of the pixels 301 and 302 which are arranged on the left side in the X-axis direction, and each of the pixels 303 and 304 which are arranged on the right side in the X-axis direction.

2. Priority of MOS-type Solid-state Imaging Device 3

As shown in FIG. 10, in the MOS-type solid-state imaging device 3, the charge transfer lines 3018 to 3048 are formed in the lower layer so as to be farther from the vertical signal lines 3017 to 3047 formed in the upper layer than the power supply lines 3016 to 3046. Therefore, parasitic capacitances C3012 to C3042 between the charge transfer lines 3018 to 3048 and the vertical signal lines 3017 to 3047 are smaller than parasitic capacitances C3011 to C3041 between the charge transfer lines 3018 to 3048 and the power supply lines 3016 to 3046, and thus a ratio to a capacitance C of the FD is small.

Also, in the MOS-type solid-state imaging device 3 of the second embodiment, the power supply lines 3016 to 3046 and the charge transfer lines 3018 to 3048 are arranged symmetrically with respect to the imaginary plane extending from the center $L_3$ of the sensor 30 in the direction orthogonal to the drawing page, in each of the pixels 301 and 302 and in each of the pixels 303 and 304. Therefore, in the pixels 301 to 304, the parasitic capacitances C3012 to C3042 indicate substantially same values.

Moreover, because the charge transfer lines 3018 to 3048 and the power supply lines 3016 to 3046 are both formed in the lower layer, intervals between the charge transfer lines 3018 to 3048 and the power supply lines 3016 to 3046 do not vary in the pixels 301 to 304. Therefore, the parasitic capacitances C3011 to C3041 indicate substantially same values. Thus, in the MOS-type solid-state imaging device 3 of the second embodiment, shading can be suppressed more than the MOS-type solid-state imaging device 1 of the first embodiment.

Note that because the vertical signal lines 3017 to 3047 formed in the upper layer are arranged in the shifted positions located toward the center $L_3$ of the sensor 30 in the MOS-type solid-state imaging device 3 of the second embodiment, a high oblique-incidence characteristic can be obtained.

3. Connection Layout in Boundary Area 30c

In the MOS-type solid-state imaging device 3 of the second embodiment, the connection layout of the MOS-type solid-state imaging device 1 shown in FIGS. 5 to 8 can be basically used by changing them properly. The following describes a connection layout of a boundary area 30c between an effective pixel area and a light shielding pixel area 30b in the sensor 30, with reference to FIGS. 11A and 11B.

Figure 11A:
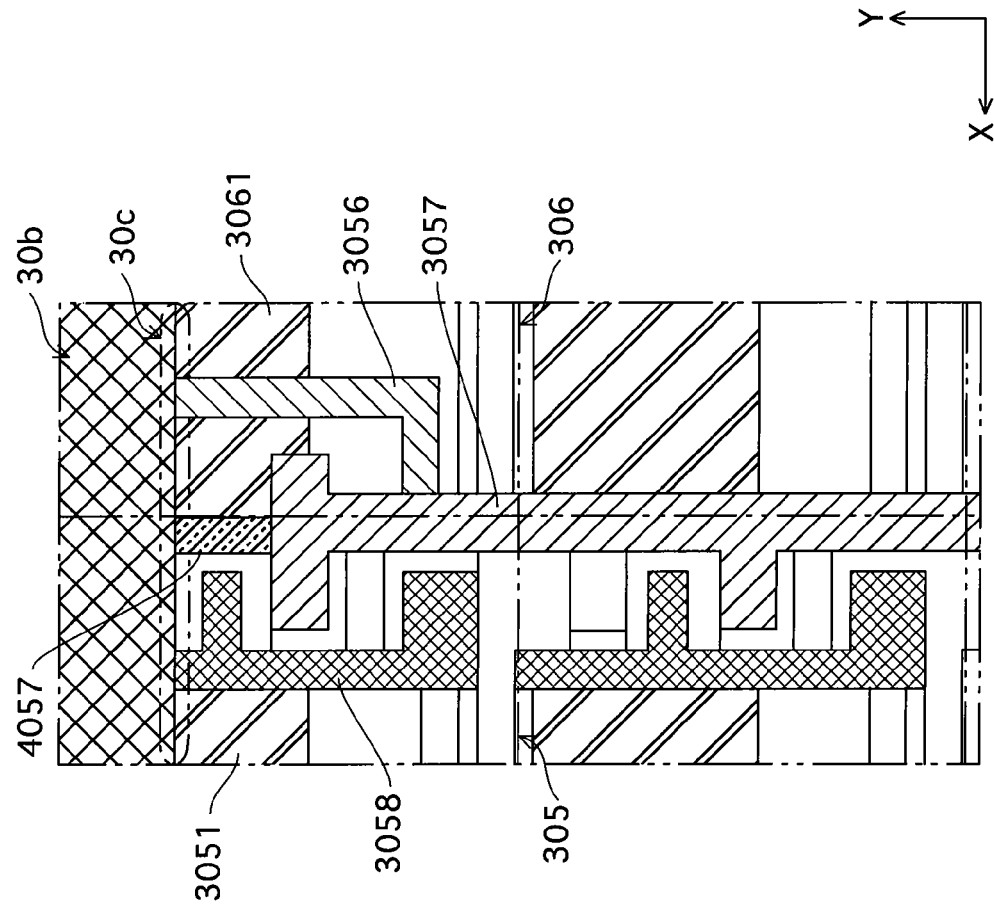
FIG. 11A is a connection diagram showing a connection layout of a lower layer in a boundary area 30c between an effective pixel area and a light shielding pixel area in the sensor 30.

As shown in FIG. 11A, in a pixel 305 including photodiode 3051 which is located at the boundary area 30c, a charge transfer line 3058 and a vertical signal line 4057 are formed in the lower layer. As mentioned above, the vertical signal lines 3017 to 3047 are formed in the upper layer in the pixels 301 to 304 in the effective pixel area of the sensor 30 (refer to FIG. 10). However, in the pixel 305 in the boundary area 30c, the vertical signal line 4057 is formed in the lower layer in order to avoid the metal wire for shielding light.

The vertical signal line 4057 in the pixel 305 includes a part parallel to the charge transfer line 3058, and a lower end part of the vertical signal line 4057 in a Y-axis direction is formed in a shape of "T". Also, three contact plugs 4059 are formed in the T-shaped part.

In the MOS-type solid-state imaging device 3, a power supply line 3056 which is connected to a pixel closer to the effective pixel area side than the boundary area 30c (lower side area in the Y-axis direction) is cranked in order to avoid the vertical signal line 4057 in the pixel 305. A tip of the power supply line 3056 is located on an upper side of a photodiode 3061 in a pixel 306 which is adjacent to the pixel 305 on a right side in an X-axis direction, and is formed in a shape of "T". Also, in the power supply line 3056, three contact plugs 3059 are formed in the T-shaped part.

Figure 11B:
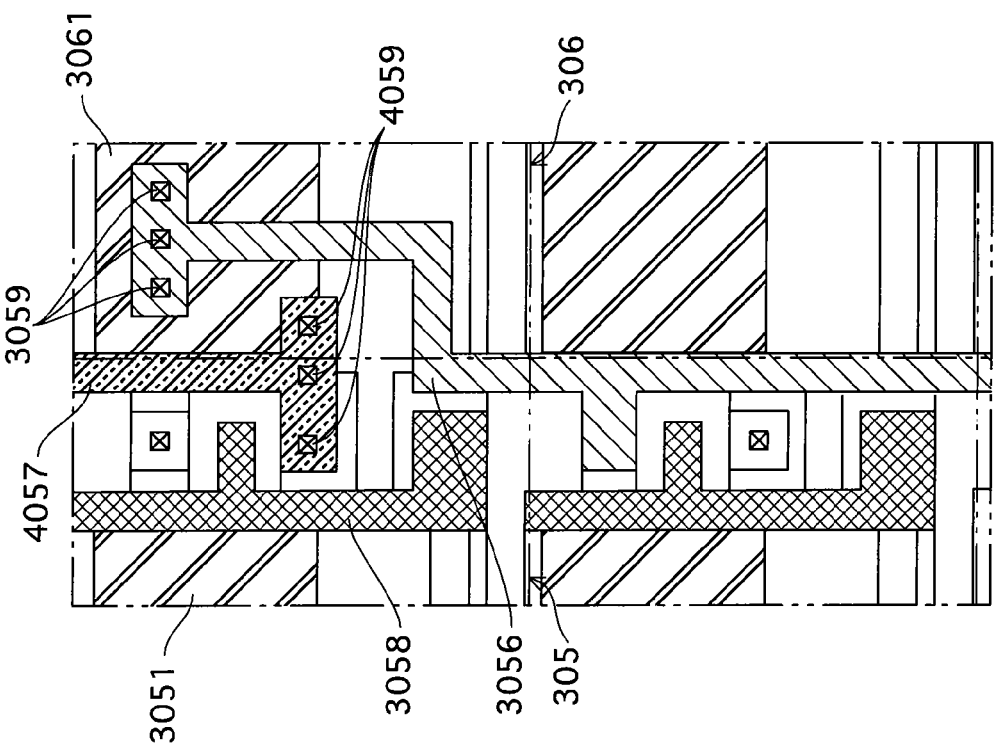
FIG. 11B is a connection diagram showing a connection layout of an upper layer in the boundary area 30c between the effective pixel area and the light shielding pixel area in the sensor 30.

As shown in FIG. 11B, on an upper side of the power supply line 3056 in the upper layer, a vertical signal line 3057 is formed, and a tip of the vertical signal line 3057 is formed in a shape of "T". The tip of the vertical signal line 3057 is connected to the vertical signal line 4057 in the light shielding pixel area 30b using the three contact plugs 4059.

In the light shielding pixel area 30b, a whole area of the upper layer is covered with the metal wire for shielding light. The metal wire in the light shielding pixel area 30b is connected to the power supply line 3056 using the three contact plugs 3059. In detail, the metal wire in the light shielding pixel area 30b functions as a power supply line. The charge transfer line 3058 and the vertical signal line 3057 are formed in the lower layer in the light shielding pixel area 30b, so as to be isolated from and pass through the metal wire.

As mentioned above, in the MOS-type solid-state imaging device 3 of the second embodiment, the vertical signal lines 3017 to 3057 are formed in the upper layer in the effective pixel area of the sensor 30, and the vertical signal line 4057 is formed in the lower layer in the light shielding pixel area 30b. This is because of the following reasons. It is most desirable that a power supply line is used as the metal wire for covering a whole area of the light shielding pixel area 30b. Also, because of the above reason, it is preferable that the vertical signal lines 3017 to 3057 are formed in the upper layer in the effective pixel area.

Also, the three contact plugs 3059 and the three contact plugs 4059 are used for connections between lines in the MOS-type solid-state imaging device 3 of the second embodiment in order to reduce an electric resistance. Thus, it is preferable that the formation number of contact plugs is larger in an allowable range in view of a size.

(Supplement)

In the above-mentioned first and second embodiments, the sensors 10 and 30 each having a one-pixel one-cell structure are adopted as an example. However, the present invention is not limited to this, and can adopt a multi-pixel one-cell structure, such as a two-pixel one-cell structure or a four-pixel one-cell structure. Also, in the first and second embodiments, in the sensors 10 and 30, the plurality of pixels 101 to 105, and 301 to 306 are arranged in a matrix. However, the present invention is not limited to this arrangement, and can adopt a pixel structure of, for example, a honeycomb shape.

Moreover, in the first embodiment, the charge transfer lines 1018 to 1058 are formed in the upper layer, and in the second embodiment, the vertical signal lines 3017 to 3057 are formed in the upper layer. However, a structure in which the power supply line is formed in the upper layer can be adopted. Furthermore, in the first and second embodiments, the power supply line, the vertical signal line, and the charge transfer line are formed in two layers. However, these lines can be formed in three layers.

Also, in the first and second embodiments, all of the power supply lines 1006..., the vertical signal lines 1007..., and the charge transfer lines 1008... are arranged symmetrically with respect to the imaginary plane. However, the present invention is not limited to this structure. For example, the present invention may have a structure in which the charge transfer lines 1008... and the power supply lines 1006... are arranged symmetrically with respect to the imaginary plane, or the charge transfer lines 1008... and the vertical signal lines 1007... are arranged symmetrically with respect to the imaginary plane.

When the above structure is adopted, intervals between the power supply lines 1006... and the charge transfer lines 1008, and intervals between the vertical signal lines 1007... and the charge transfer lines 1008 are substantially equal in all of the pixels 101 to 105, and 301 to 306 in the sensors 10 and 30. Also, a difference between the parasitic capacitances in the FD 1003 and the FD1013 is smaller than the solid-state imaging devices disclosed in the patent documents (Japanese Published Patent Application No. 2004-186407, Japanese Published Patent Application No. 2002-335455, and U.S. Pat. No. 6,838,715). Therefore, in the solid-state imaging device of the present invention, shading can be suppressed more because of the smaller difference.

Moreover, in the first and second embodiments, the source of the amplifying transistor is connected to the vertical signal line. However, a selecting transistor may be inserted between the source of the amplifying transistor and the vertical signal line.

Furthermore, in the first and second embodiments, out of lines in the sensor of the MOS-type solid-state imaging device, the arrangement relation between the power supply lines 1006..., the vertical signal lines 1007..., and the charge transfer lines 1008... which are largely concerned with the parasitic capacitances in the FD 1003 and the FD1013 has been described. However, in addition to the power supply lines 1006..., the vertical signal lines 1007..., and the charge transfer lines 1008... for example, a ground line may be formed in the orthogonal direction (in the Y-axis direction in FIGS. 5 to 7D).

Also, in the first and second embodiments, the line formed in the upper layer is in the shifted position located toward the center of the sensor. However, the line is not required to be in the shifted position located toward the center, and may be in the shifted position toward the vicinity of the center.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be constructed as being included therein.

What is claimed is:

1. A solid-state imaging device including an image area that is composed of a plurality of pixels arranged two-dimensionally in a direction along one main surface of a semiconductor substrate, the solid-state imaging device comprising:

photodiodes each for performing a photoelectric conversion to generate a charge, each of the photodiodes being provided in a different one of the plurality of pixels;

floating diffusions each for receiving the charge transferred from a corresponding one of the photodiodes, each of the floating diffusions being provided in a different one of the plurality of pixels;

amplifying transistors each for amplifying the charge transferred from a corresponding one of the floating diffusions, each of the amplifying transistors being provided in a different one of the plurality of pixels;

first lines each for connecting a corresponding one of the floating diffusions to a gate of a corresponding one of the amplifying transistors, each of the first lines being provided in a different one of the plurality of pixels;

second lines each for supplying power, each of the second lines being connected to one of a drain and a source of a corresponding one of the amplifying transistors; and third lines each for outputting a signal amplified by the amplifying transistor, each of the third lines being connected to another one of the drain and the source of the amplifying transistor, wherein:

one of the first, second, and third lines is arranged in one of a plurality of layers in a thickness direction of the semiconductor substrate on the one main surface of the semiconductor substrate, and the other lines are arranged in another layer of the plurality of layers, in each pixel surrounding a center of the image area in the direction along the one main surface of the semiconductor substrate, one line out of the first, second, and third lines provided in one of the plurality of layers farthest from the one main surface of the semiconductor substrate is in a shifted position located toward the center of the image area, in each two oppositely disposed pixels with the center of the image area sandwiched therebetween, the first line and at least one of the second and third lines are disposed symmetrically with respect to an imaginary plane extending from the center of the image area in a direction orthogonal to both of the shift direction and the direction along the one main surface of the semiconductor substrate, a light shielding pixel area is provided adjacent to the image area so as to surround the image area in the direction along the one main surface of the semiconductor substrate, the light shielding pixel area is shielded from light by a conductive layer which is provided in a layer on a same level as the layer farthest from the one main surface of the semiconductor substrate, the first and third lines are provided in a layer closer to the one main surface of the semiconductor substrate than the layer in which the conductive layer is provided, and the first and third lines are provided so as to be extended between the image area and the light shielding pixel area.

2. The solid-state imaging device of claim 1, wherein in the each two oppositely disposed pixels with the center of the image area sandwiched therebetween, all of the first, second, and third lines are disposed symmetrically with respect to the imaginary plane.

3. The solid-state imaging device of claim 1, wherein in each of the plurality of pixels, the first line is provided as the one line in the layer farthest from the one main surface of the semiconductor substrate, and the second and third lines are provided in a layer closer to the one main surface of the semiconductor substrate than the layer in which the first line is provided.

4. The solid-state imaging device of claim 3, wherein in the image area, each of the third lines is provided toward the center of the image area in each pixel to which the third line is connected.

5. The solid-state imaging device of claim 3, wherein
in each of the plurality of pixels in the image area, the first line is provided away from a center of the pixel in an opposite direction to the center of the image area.

6. The solid-state imaging device of claim 1, wherein
in each of the plurality of pixels, a corresponding one of the third lines is provided as the one line in the layer farthest from the one main surface of the semiconductor substrate, and the first and second lines are provided in a layer closer to the one main surface of the semiconductor substrate than the layer in which the third line is provided.

7. The solid-state imaging device of claim 1, wherein
in the image area, at least one of the first and third lines is provided in the layer farthest from the one main surface of the semiconductor substrate, and the at least one line provided in the layer farthest from the one main surface of the semiconductor substrate is connected between the image area and the light shielding pixel area with a plurality of contact plugs.

8. The solid-state imaging device of claim 1, wherein
in each of the plurality of pixels, a corresponding one of the second lines is provided as the one line in the layer farthest from the one main surface of the semiconductor substrate, and the first and third lines are provided in a layer closer to the one main surface of the semiconductor substrate than the layer in which the second line is provided.

* * * * *